(12) United States Patent
Fossum

(10) Patent No.: US 6,825,059 B2
(45) Date of Patent: Nov. 30, 2004

(54) ACTIVE PIXEL SENSOR ARRAY WITH ELECTRONIC SHUTTERING

(75) Inventor: Eric R. Fossum, Crescenta, CA (US)

(73) Assignee: California Institute of Technology, Pasadena, CA (US)

( * ) Notice: Subject to any disclaimer, the term of this patent is extended or adjusted under 35 U.S.C. 154(b) by 86 days.

(21) Appl. No.: 10/305,688

(22) Filed: Nov. 26, 2002

(65) Prior Publication Data

US 2003/0111674 A1 Jun. 19, 2003

Related U.S. Application Data

(62) Division of application No. 08/787,778, filed on Jan. 22, 1997, now Pat. No. 6,486,503, which is a continuation-in-part of application No. 08/558,521, filed on Nov. 16, 1995, now Pat. No. 6,101,232, which is a continuation of application No. 08/188,032, filed on Jan. 28, 1994, now Pat. No. 5,471,515.

(60) Provisional application No. 60/010,305, filed on Jan. 22, 1996, and provisional application No. 60/013,700, filed on Mar. 20, 1996.

(51) Int. Cl.$^7$ .............................................. H01L 21/00

(52) U.S. Cl. .............................. 438/60; 438/57; 438/59; 438/66; 438/48; 438/73; 438/75

(58) Field of Search .............................. 438/48, 57, 59, 438/60, 66, 73, 75

(56) References Cited

U.S. PATENT DOCUMENTS 5,471,515 A * 11/1995 Fossum et al. ............... 377/60
6,101,232 A * 8/2000 Fossum et al. ............... 377/60
6,486,503 B1 * 11/2002 Fossum ....................... 257/215

* cited by examiner

Primary Examiner—Long Pham
(74) Attorney, Agent, or Firm—Fish & Richardson P.C.

(57) ABSTRACT

An active pixel cell includes electronic shuttering capability. The cell can be "shuttered" to prevent additional charge accumulation. One mode transfers the current charge to a storage node that is blocked against accumulation of optical radiation. The charge is sampled from a floating node. Since the charge is stored, the node can be sampled at the beginning and the end of every cycle. Another aspect allows charge to spill out of the well whenever the charge amount gets higher than some amount, thereby providing anti blooming.

1 Claim, 6 Drawing Sheets

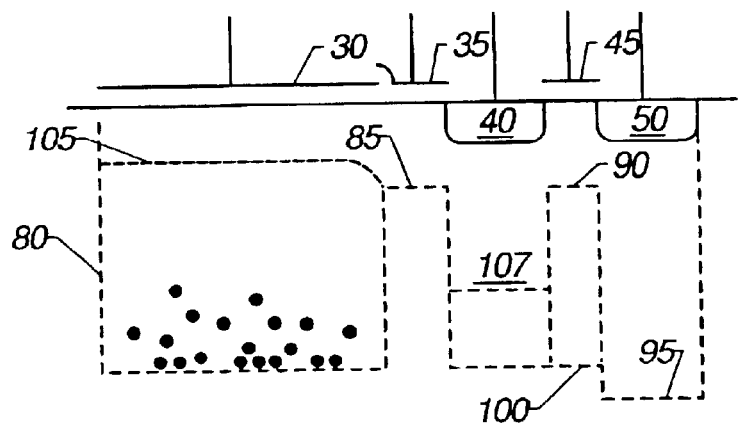
FIG. 4
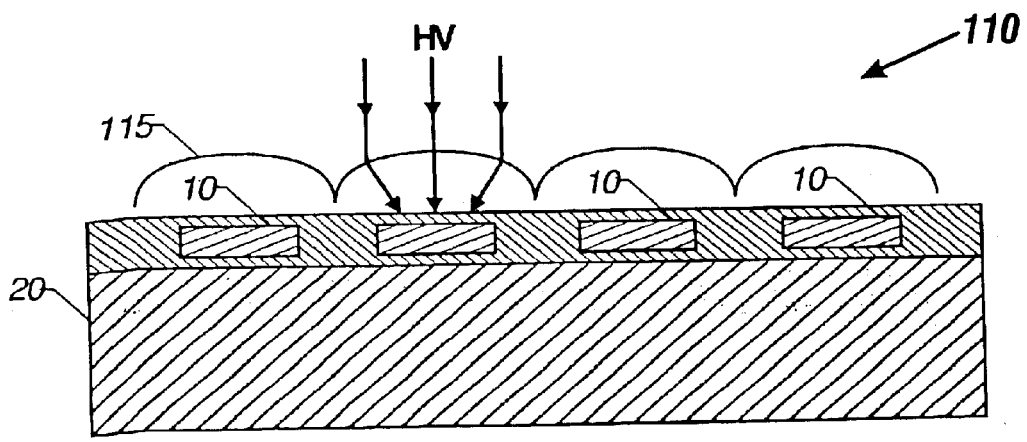
FIG. 5
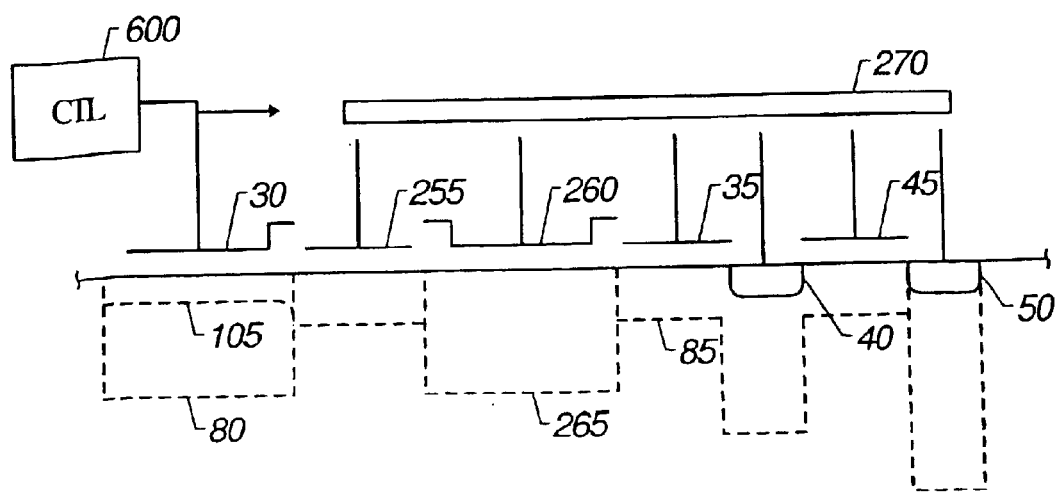

ACTIVE PIXEL SENSOR ARRAY WITH ELECTRONIC SHUTTERING

CROSS-REFERENCE TO RELATED APPLICATIONS

This application is a divisional application of and claims priority to U.S. application Ser. No. 08/787,778, filed on Jan. 22, 1997 U.S. Pat. No. 6,486,503.

This application is a continuation-in-part of U.S. patent application Ser. No. 08/558,521 filed Nov. 16, 1995 now U.S. Pat. No. 6,101,232, which is a continuation of Ser. No. 08/188,032 filed Jan. 28, 1994 now U.S. Pat. No. 5,471,515 entitled ACTIVE PIXEL SENSOR WITH INTRA-PIXEL CHARGE TRANSFER by Eric R. Fossum et al. and assigned to the present assignee. This application also claims priority from provisional application No. 60/010,305, filed Jan. 22, 1996, and from provisional application No. 60/013,700, filed Mar. 20, 1996.

ORIGIN OF THE INVENTION

The invention described herein was made in the performance of work under a NASA contract, and is subject to the provisions of Public Law 96-517 (35 USC 202) in which the Contractor has elected to retain title.

FIELD OF THE INVENTION

The invention is related to semiconductor imaging devices. More specifically, the present invention relates to a silicon imaging device which can be fabricated using a CMOS compatible process, and specific improved techniques that are used by such a system.

BACKGROUND AND SUMMARY

Many semiconductors can be used for acquiring a signal indicative of an image. Charge coupled devices (CCDs), photodiode arrays, charge injection devices and hybrid focal plane arrays are some of the more commonly used devices. CCDs are often used, since they represent a mature technology, are capable of large formats and very small pixel size and they facilitate noise-reduced charge domain processing techniques such as binning and time delay integration.

However, CCD imagers suffer from a number of drawbacks. For example, the signal fidelity of a CCD decreases as the charge transfer efficiency is raised to the power of the number of stages. Since CCDs use many stages, the CCD fabrication technique needs to be optimized for very efficient charge transfer efficiency. CCDs are also susceptible to radiation damage, require good light shielding to avoid smear and have high power dissipation for large arrays.

The specialized CCD semiconductor fabrication process is intended to maximize the charge transfer efficiency of the CCD. This specialized CCD process, however, has been incompatible with the complementary metal oxide semiconductor ("CMOS") processing which has been conventionally used. The image signal processing electronics required for the imager are often fabricated in CMOS. Accordingly, it has been difficult to integrate on-chip signal processing electronics in a CCD imager, because of the incompatibility of the processing techniques. Because of this problem, the signal processing electronics has often been carried out off-chip.

Typically, each column of CCD pixels is transferred to a corresponding cell of a serial output register, whose output is amplified by a single on-chip amplifier (e.g., a source follower transistor) before being processed in off-chip signal processing electronics. This architecture limits the read-out frame rate which the on-chip amplifier can handle proportional to the number of charge packets divided by the number of pixels in the imager.

The other types of imager devices have problems as well. Photodiode arrays exhibit high kTC noise. The KTC noise makes it impractical to reset a diode or capacitor node to the same initial voltage at the beginning of each integration period. Photodiode arrays also suffer from lag. Charge injection devices also have high noise.

Hybrid focal plane arrays exhibit less noise but are prohibitively expensive for many applications and have relatively small array sizes.

In view of the inventors recognition of the above problems, it is one object of the present invention to provide an imager device which has the low kTC noise level of a CCD without the associated CMOS incompatibility and other above-described problems.

In addition, there is a need in imaging devices to control the integration or exposure time of the sensor. This control allows decreasing the integration time for imaging relatively bright objects to avoid saturating the pixels. Conversely, it is sometimes desirable to increase the integration time to increase the resolution of relatively dim objects.

Control of the integration time is also advantageous in video imaging applications where it is desired that this period be less than the inverse of the frame rate. Thus, if the integration period is T and the frame rate is f, it is desirable that $T \leq 1/f$.

Integration time has been controlled in the past with mechanical shutters. However, the mechanical nature of these devices made the shuttering imprecise. This caused the integration time to vary significantly. In addition, once configured, the mechanical-type shutters could not easily be adjusted, for example, to shutter a different portion of the array or to change adaptively. A controllable electronic shutter in each pixel cell would provide a more efficient, precise, and versatile way of setting the integration time of the array or a part of the array.

Furthermore, it is advantageous in some applications that some or all the pixels be integrated simultaneously for the same absolute period of time. This simultaneous integration prevents motion skew in the image by providing a "stop-action" or "snap shot" image. The alternative to simultaneous integration is to accumulate charge in only a portion of the pixel cells being employed to image an observed scene. For example, an imaging system might operate by scanning a row of the array at a time to produce an overall image. Thus, the resultant image has a series of lines, each of which represents a part of the observed scene at a different time. Obviously, if the scene is changing quickly enough, the image will be skewed as stated above. Therefore, this piecemeal method of creating an image would be inappropriate for certain quickly changing scenes. However, by integrating all the pixels in the array simultaneously and capturing the accumulated charge, a "snap shot" of the scene encompassing the period of integration can be obtained. The captured accumulated charge would then be readout and processed in some sequential method to create the desired image.

In view of the above, one aspect of the present invention is embodied in an imaging device formed as a monolithic complementary metal oxide semiconductor integrated circuit in an industry standard complementary metal oxide semiconductor process. The integrated circuit includes a focal plane array of pixel cells, each one of the cells including a photosensing element, e.g., a photogate, overlying the substrate for accumulating photo-generated charge in an underlying portion of the substrate and a charge coupled device section formed on the substrate adjacent the photogate having a sensing node and at least one charge coupled device stage for transferring charge from the underlying portion of the substrate to the sensing node.

In a preferred embodiment, the sensing node of the charge coupled device section includes a floating element—e.g., a diffusion, and the charge coupled device stage includes a transfer gate overlying the substrate between the floating diffusion and the photogate. This preferred embodiment can further include apparatus for periodically resetting a potential of the sensing node to a predetermined potential, including a drain diffusion connected to a drain bias voltage and a reset gate between the floating diffusion and the drain diffusion, the reset gate connected to a reset control signal.

The imaging device also includes a readout circuit having at least an output transistor. Preferably, the output transistor is a field effect source follower output transistor formed in each one of the pixel cells, the floating diffusion being connected to its gate. Also, the readout circuit can further include a field effect load transistor connected to the source follower output transistor, and preferably a correlated double sampling circuit having an input node connected between the source follower output transistor and load transistor. The focal array of cells is also preferably organized by rows and columns, and the readout circuit has plural load transistors and plural correlated double sampling circuits. In this case, each cell in each column of cells is connected to a single common load transistor and a single common correlated double sampling circuit. These common load transistors and correlated double sampling circuits are disposed at the bottom of the respective columns of cells to which they are connected.

In the preferred implementation, charge is first accumulated under the photogate of a pixel cell. Next, the correlated double sampling circuit samples the floating diffusion after it has been reset. The accumulated charge is then transferred to the floating diffusion and the sampling process is repeated with the result stored at another capacitor. The difference between the two stored values represents the signal output. In accordance with a further refinement, this difference is corrected for fixed pattern noise by subtracting from it another difference sensed between the two values while they are temporarily shorted.

The imaging device can also have a micro-lens layer overlying the substrate. This micro-lens layer includes a refractive layer and individual lenses formed in the layer which are in registration with individual ones of the cells. Each of the individual lenses has a curvature for focusing light toward a photosensitive portion of the respective cell.

In addition, the imaging device can further include an electronic shutter formed on the substrate adjacent the photogate. This electronic shutter is capable of draining charge from the portion of the substrate underlying the photogate, thus preventing any accumulation thereof. Accordingly, when the electronic shutter is "closed" such that charge is being drained from the portion of the substrate under the photogate, the pixel cell is essentially deactivated. When the electronic shutter is in an "open" mode, charge is allowed to accumulate under the photogate and the cell operates as described above.

The electronic shutter is preferably set in the "open" mode such that whenever charge accumulates under the photogate to a predetermined maximum level, any excess drains into a special sink in the electronic shutter, rather than into the floating diffusion. In this way, the electronic shutter provides a way to control the integration period of the cell, as well as lateral anti-blooming.

In addition to the just-described benefits, other objectives and advantages of the present invention will become apparent from the detailed description which follows hereinafter when taken in conjunction with the drawing accompanying figures.

BRIEF DESCRIPTION OF THE DRAWINGS

These and other aspects of the invention will now be described in detail with reference to the accompanying drawings, wherein:

FIG. 4 is a graph of the surface potential in the charge transfer section of the cell of FIG. 3A;

FIG. 5 is a cross-sectional view of an alternative embodiment of the focal plane array of FIG. 2 including a microlens layer.

FIG. 6 is a schematic diagram of an alternate embodiment of the cell of FIG. 3A with a storage well and an additional charge coupled device stage, and includes a graph of the surface potential in the charge transfer section.

DETAILED DESCRIPTION OF THE PREFERRED EMBODIMENTS

Figure 1:
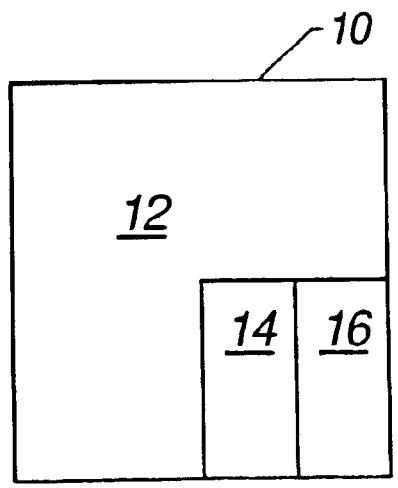
FIG. 1 is a diagram illustrating the architecture of a preferred individual focal plane cell.

FIG. 1 is a simplified block diagram of one pixel cell 10 of a focal plane array of many such cells formed in an integrated circuit. Each cell 10 includes a photogate 12, a charge transfer section 14 adjacent the photogate 12 and a readout circuit 16 adjacent the charge transfer section 14. FIG. 1 shows these elements with the square area being labelled the pixel, but it should be understood that these elements can alternatively be physically located outside the area called the pixel.

Figure 2:
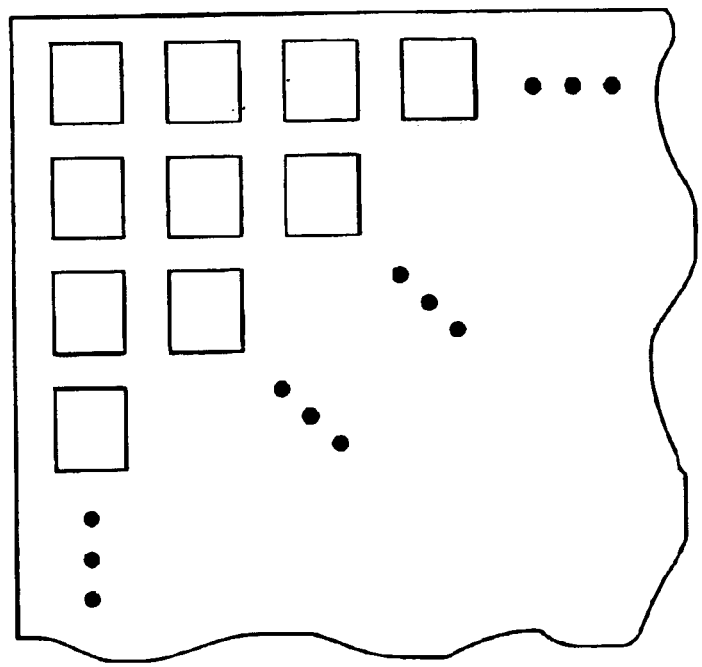
FIG. 2 is a plan view of an integrated circuit having a focal plane array of cells of the type illustrated in FIG. 1.

FIG. 2 shows a focal plane array of many cells 10 formed on a silicon substrate 20.

Figure 3A:
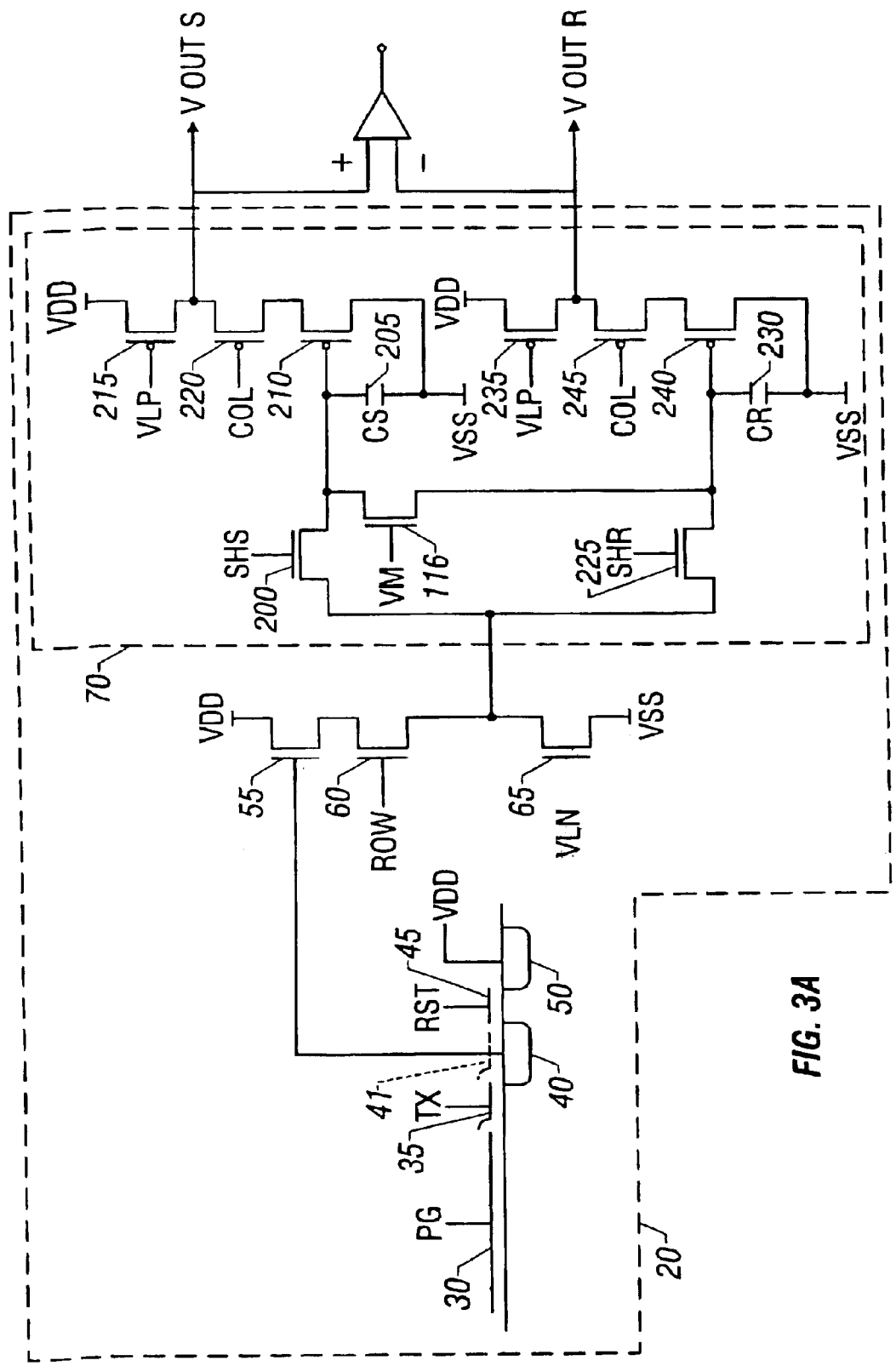
FIG. 3A is a schematic diagram of the cell of FIG. 1.

FIG. 3A is a simplified schematic diagram of a cell 10 and its associated processing. Each pixel 300 includes a photogate area and its associated circuitry (30–50) and row decoder elements 55, 60. FIG. 3A shows the photogate 12 having a relatively large photogate electrode 30 overlying the substrate. The charge transfer section 14 has a transfer gate electrode 35 adjacent the photogate electrode 30, a floating diffusion 40, a reset electrode 45 and a drain diffusion 50. The readout circuit 16 has a source follower field effect transistor (FET) 55, a row select FET 60, a load FET 65 and a correlated double sampling circuit 70.

The surface potential diagram of FIG. 4 shows the photogate electrode 30 being held by a photogate signal PG at a positive voltage to form a potential well 80 in the substrate 20 in which photo-generated charge is accumulated during an integration period. The transfer gate electrode 35 is initially held at a less positive voltage by a transfer gate signal TX to form a potential barrier 85 adjacent the potential well 80. The floating diffusion 40 is connected to the gate of the source follower FET 55 whose drain is connected to a drain supply voltage VDD. The reset electrode 45 is initially held by a reset signal RST at a voltage corresponding to the voltage on the transfer gate 30 to form a potential barrier 90 thereunder. The drain supply voltage VDD connected to the drain diffusion 50 creates a constant potential well 95 underneath the drain diffusion 50.

During the integration period, electrons accumulate in the potential well 80 in proportion to photon flux incident on the substrate 20 beneath the photogate electrode 30. At the end of the integration period, the surface potential beneath the floating diffusion 40 is quickly reset to a potential level 100 slightly above the potential well 95. This is accomplished by the reset signal RST temporarily increasing to a higher positive voltage to temporarily remove the potential barrier 90 and provide a downward potential staircase from the transfer gate potential barrier 85 to the drain diffusion potential well 95, as indicated in the drawing of FIG. 4. After the reset gate 45 is returned to its initial potential (restoring the potential barrier 90), the readout circuit 70 briefly samples the potential of the floating diffusion 40, and then the cell 10 is ready to transfer the photo-generated charge from beneath the photogate electrode 30. For this purpose, the photogate signal PG decreases to a less positive voltage to form a potential barrier 105 beneath the photogate electrode 30 and thereby provide a downward staircase surface potential from the photogate electrode 30 to the potential well 100 beneath the floating diffusion 40. This operation transfers the charge from beneath the photogate electrode 30 to the floating diffusion 40, changing the potential of the floating diffusion 40 from the level (100) at which it was previously reset to a new level 107 indicative of the amount of charge accumulated during the integration period. This new potential of the floating diffusion 40 is sensed at the source of the source follower FET 55. However, before the readout circuit 70 samples the source of the source follower FET 55, the photogate signal PG returns to its initial (more positive) voltage. The entire process is repeated for the next integration period.

The readout circuit 70 has a signal sample and hold (S/H) circuit including an S/H FET 200 and a signal store capacitor 205 connected through the S/H FET 200 and through the row select FET 60 to the source of the source follower FET 55. The other side of the capacitor 205 is connected to a source bias voltage VSS. The one side of the capacitor 205 is also connected to the gate of an output FET 210. The drain of the output FET is a connected through a column select FET 220 to a signal sample output node VOUTS and through a load FET 215 to the drain voltage VDD. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also has a reset sample and hold (S/H) circuit including an S/H FET 225 and a signal store capacitor 230 connected through the S/H FET 225 and through the row select FET 60 to the source of the source follower FET 55. The other side of the capacitor 230 is connected to the source bias voltage VSS. The one side of the capacitor 230 is also connected to the gate of an output FET 240. The drain of the output FET 240 is connected through a column select FET 245 to a reset sample output node VOUTR and through a load FET 235 to the drain voltage VDD. A signal called "reset sample and hold" (SHR) briefly turns on the S/H FET 225 immediately after the reset signal RST has caused the resetting of the potential of the floating diffusion 40, so that the capacitor 230 stores the voltage to which the floating diffusion has been reset.

The readout circuit provides a special form of correlated double sampling of the potential of the floating diffusion, allowing the charge integrated beneath the photogate 12 during each integration period to be obtained at the end of each integration period from the difference between the voltages at the output nodes VOUTS and VOUTR of the readout circuit 70. This minimizes the effects of kTC noise because the difference between VOUTS and VOUTR is independent of any variation in the reset voltage on the floating diffusion 40. It also suppresses fixed pattern noise produced by threshold variations in transistor 55. It also suppresses 1/F noise produced by transistors 55, 60 and 65.

FIG. 5 shows a transparent refractive microlens layer 110 which may be deposited over the top of the focal plane array of FIG. 2. The microlens layer 110 has spherical portions 115 centered over each of the cells 10 and contoured so as to focus light toward the center of each photogate 12. This has the advantage of using light that would otherwise fall outside of the optically active region of the photogate 12. For example, at least some of the light that is ordinarily incident on either the charge transfer section 14 or the readout circuit 16 (FIG. 1) would be sensed in the photogate area with the addition of the microlens layer 110. This has the effect of maximizing real estate—the portions of the substrate which include the non-photogate area are focused to another point.

Figure 6A:
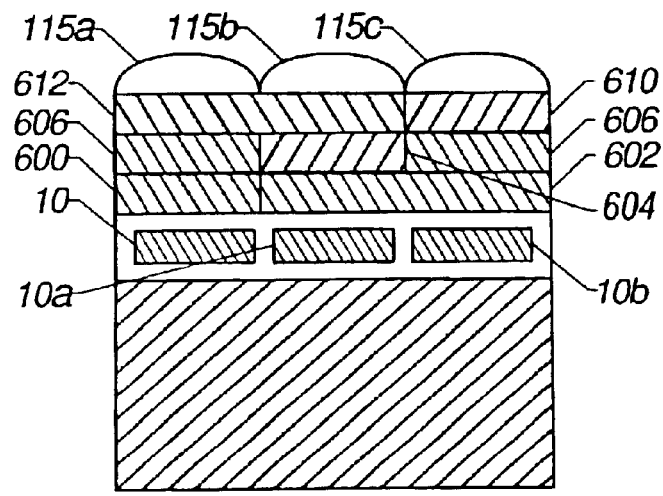
FIG. 6A shows a polymer filter embodiment.
Figure 6B:
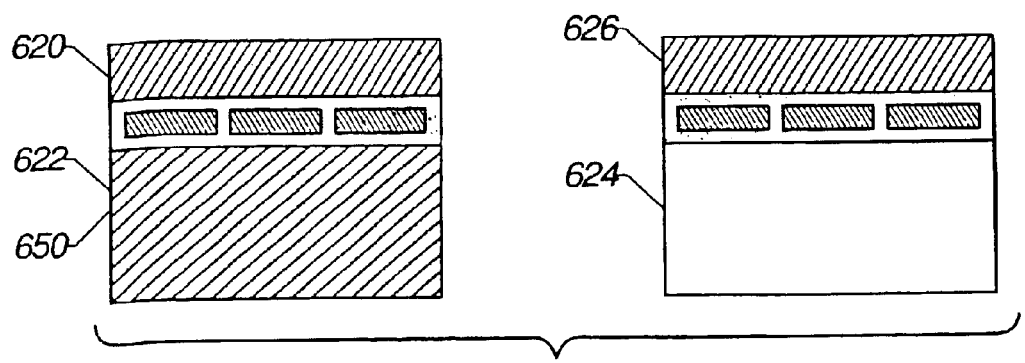
FIG. 6B shows a multiple chip, separate color embodiment.

FIGS. 6A and 6B show an alternative embodiment of the invention which uses color filtering. Color filtering enables spatial separation of color in an imaging device. CCD devices, for example, commonly use kind of color separation in this way.

The preferred system allows a plurality of pixels to have different color filtering properties to provide a color filtering effect. Typically this is done by using the color filters in some array form: For example, alternate green filters interspersed with red and blue filters. An exemplary filter operation would use green/red/green/blue/green/red/green/blue with that pattern continuing for the length of the array.

According to this embodiment of the present invention, color filters are used to supplement the lens operation of FIG. 5.

The preferred system embodies its operation in one of the two forms shown in FIGS. 6A and 6B. The first form shown in FIG. 6A uses a polymer color filter array. Such polymer color filter arrays are well-known in the art. Layer 600 is preferably a red layer, and is first deposited over the entire chip. Subsequent to deposition, an etching technique is used to remove the red filter area 600 from everywhere except over the desired pixel 10. A planarization layer 602 covers the removed areas to thereby planarize that surface, thereby flattening the surface. Blue filter 604 is next deposited over pixel 10A. Blue filter 604 is similarly etched such that it only covers the desired pixel 10A. The remaining area is planarized by a second planarization layer 606. Finally, a green filter 610 is formed over that planarized layer, covering pixel 10B. Planarization layer 612 flattens the resulting area so that green filter 610 only covers the pixel 10B.

Each pixel, including the polymer layer, is covered by microlens 115A; 115B and 115C. The microlenses modify the incoming light in conjunction with the polymer layer. The light is therefore changed by both microlenses 115A–115C and CFA parts 612, 606, and 600. Each pixel, therefore, preferably receives light that has been altered by the lens and altered by the color filter array.

This polymer color filter array sacrifices a certain amount of resolution of the scene. Each pixel of the scene is imaged by three pixels, and hence some of the pixels are dedicated to a different color.

An alternative embodiment shown in FIG. 6B does not lose resolution, but instead requires multiple chips to form any image. This would form a 3-chip camera. One chip 650 has all its pixels covered by a red filter 620. Hence that chip images the red scene—either the red components or the complement to the red components. Analogously, the other chips include green filters and blue filters. The three chips together form the entire image.

Figure 6C:
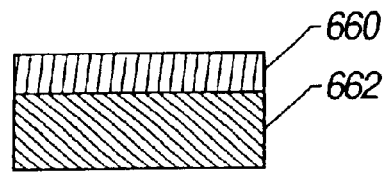
FIG. 6C shows a phosphor converting embodiment.

Yet another embodiment uses a wavelength-converting phosphor 660 as shown in FIG. 6C. A wavelength-converting phosphor is typically tuned to accept radiation of a desired wavelength, e.g., ultra-violet or x-ray. Typically the silicon underlayer is not responsive to that same wavelength. Therefore, the phosphor emits a photon of the proper type to properly excite the underlying silicon 662, when receiving this radiation. A preferred example is that the phosphor 660 is sensitive to x-ray, but emits a photon of green light that is detected by the circuitry 662 which can be a sensor of any of the kinds described herein.

While the FIG. 6C embodiment contemplates using the wavelength-converting phosphor over an entire surface of the device, it is also possible to use a pixelation effect. A shadow mask is used to mask the phosphor. The phosphor is only deposited where allowed by the shadow mask.

It should also be understood that these same techniques could be embodied in other focal plane and photodiode applications, and that the above color filter array is not limited to single readout circuit per pixel systems.

Preferably, the focal plane array corresponding to FIGS. 1–4 is implemented in MOS silicon or CMOS, or any other technology which is compatible with an industry standard CMOS fabrication process. Preferably, each of the FETs is a MOSFET, the FETs 55, 60, 65, 200 and 225 being n-channel devices and the FETs 210, 220, 225, 230, 240, 245 being p-channel devices. The n-channel MOSFETS and the CCD channel underlying the gate electrodes 30, 35, 45 and the diffusions 40 and 50 may be located in a p-well while the remaining (p-channel) devices are located outside of the p-well. The gate voltage VLP applied to the gates of the p-channel load FETs 215 and 235 is a constant voltage on the order of +2.5 volts. The gate voltage VLN applied to the n-channel load FET 65 is a constant voltage on the order of +1.5 volts.

The charge transfer section 14 preferably uses only a single CCD stage between the photogate 12 and the floating diffusion 40 in the specific embodiment of FIG. 3A. This means that there is no loss due to charge transfer inefficiency and therefore there is no need to fabricate the device with a special CCD process. As a result, the readout circuit 70 as well as the output circuitry of the FETs 55, 60 and 65 can be readily implemented as standard CMOS circuits, making them relatively inexpensive. However, any suitable charge coupled device architecture may be employed to implement the charge transfer section 14, including a CCD having more than one stage. For example, two or three stages may be useful for buffering two or three integration periods.

Other implementations of the concept of the invention may be readily constructed by the skilled worker in light of the foregoing disclosure. For example, the floating diffusion 40 may instead be a floating gate electrode. The signal and reset sample and hold circuits of the readout circuit 70 may be any suitable sample and hold circuits. Moreover, shielding of the type well-known in the art may be employed defining an aperture surrounding the photogate 12. Also, the invention may be implemented as a buried channel, n-well, or p-channel device.

Another feature of the invention which is useful for eliminating fixed pattern noise due to variations in FET threshold voltage across the substrate 20 is a shorting FET 116 across the sampling capacitors 205, 235. After the accumulated charge has been measured as the potential difference between the two output nodes VOUTS and VOUTR, a shorting signal VM is temporarily applied to the gate of the shorting FET 116 and the VOUTS-to-VOUTR difference is measured again. This latter difference is a measure of the disparity between the threshold voltages of the output FETs 210, 240, and may be referred to as the fixed pattern difference. The fixed pattern difference is subtracted from the difference between VOUTS and VOUTR measured at the end of the integration period, to remove fixed pattern noise.

As previously mentioned herein, a floating gate may be used instead of the floating diffusion 40. Such a floating gate is indicated schematically in FIG. 3A by a simplified dashed line floating gate electrode 41. In one preferred implementation, the area of the photogate 12 (i.e., the photogate electrode 30) is preferably L-shaped as shown in FIG. 1, and is about 100 square microns; the transfer gate electrode 35 and the reset gate electrode were each about 1.5 microns by about 6 microns; the photogate signal PG was varied between about +5 volts (its more positive voltage) and about 0 volts (its less positive voltage; the transfer gate signal TX was about +2.5 volts; the reset signal RST was varied between about +5 volts (its more positive voltage) and about +2.5 volts (its less positive voltage); the drain diffusion 50 was held at about +5 volts.

The array structure of FIGS. 1–4 can be modified to incorporate a preferred column parallel approach. The term column parallel approach refers to a portion of the readout circuitry being connected to the bottom on the columns of the array. This allows an entire row of the array to be processed at one time. This column approach is in contrast to a spatially parallel processing approach where each pixel has its own processing circuitry (e.g., the embodiment of FIGS. 1–4), or a serial processing approach where the output of each pixel is sequentially feed to a single processor for processing.

Figure 3B:
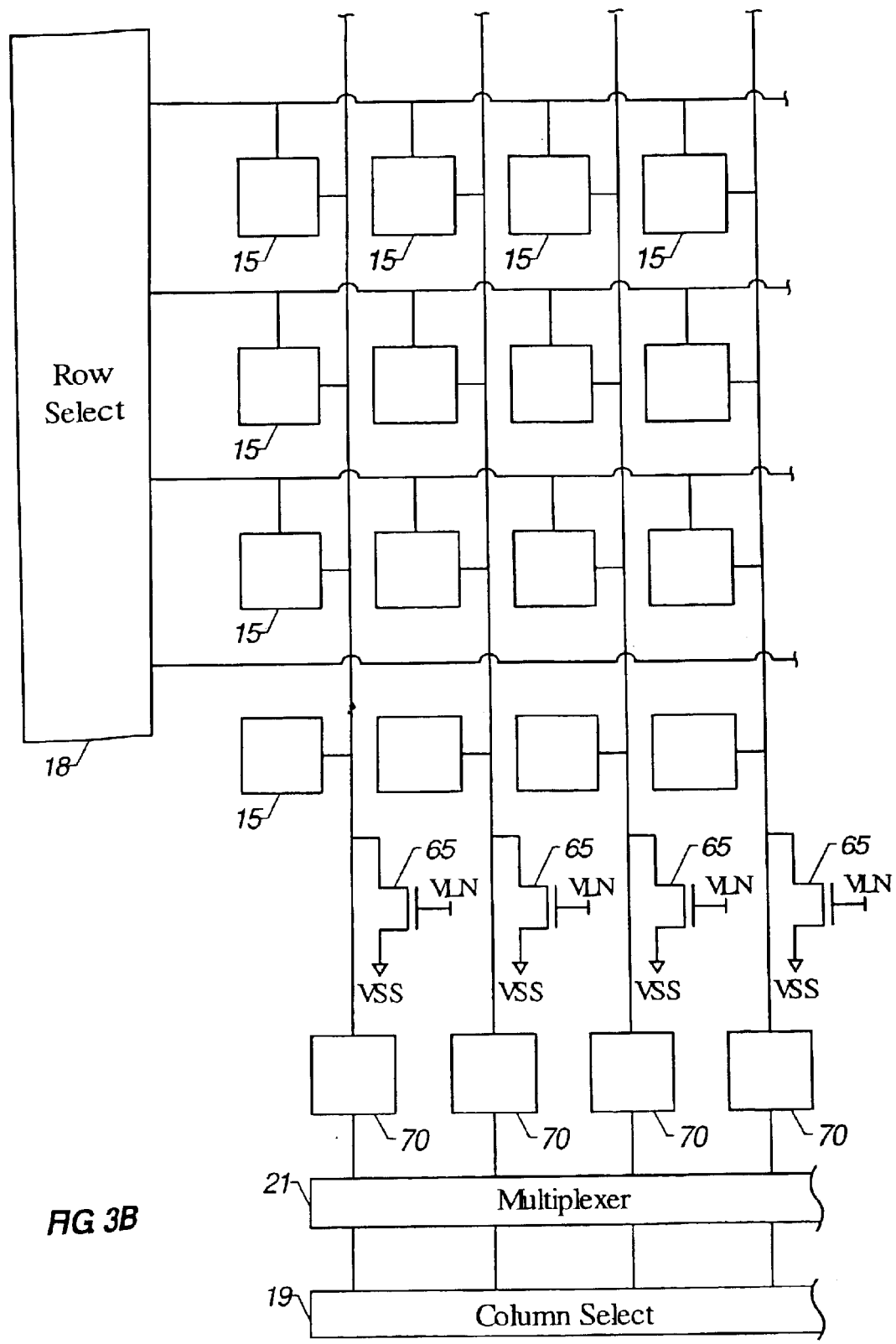
FIG. 3B is a plan view of an integrated circuit constituting a focal plane array of cells of a type similar to FIG. 1, showing the load FET and sampling circuit as common elements at the bottom of each array column.

FIG. 3B shows a column parallel approach where the load FET 65 and correlated double sampling circuit 70 are deleted from the individual pixel cells 10. Instead, each cell 10 in a column of the array is connected to a common load FET 65 and sampling circuit 70. The common elements are preferably located at the bottom of each column of the array. This column parallel array structure has a significant advantage. Since the load FET 65 and sampling circuit 70 have been removed from the pixel cells 10, there is more photosensitive cell area available. Thus, the resolution of each cell 10 is improved. The column parallel array structure is read out by selecting an entire row using standard row and column select circuitry 18, 19. Selecting a row, among other things, results in the accumulated charge being transferred from the photogate potential well 80 of each cell 10 in the row to its associated floating diffusion 40. Thereafter, the sampling circuits 70 at the bottom of each column "read" the connected pixel cell 10 in the manner described previously. A standard multiplexer 21 is then employed to output the "read" pixel cell values, either in parallel or serially.

The previous described pixel cell structure of FIGS. 3A or 3B and 4 can be further modified to include simultaneous integration of the array. In the originally-described pixel cell structure, charge accumulated in the photogate well 80 during the integration period was transferred directly to the floating diffusion 40. However, in many applications, not all the cells in the array could be read out at the same time. The charge that was transferred to the floating diffusion 40 would degrade over time.

One counter measure to this problem is to transfer only the accumulated charge for pixel cells that are currently being read out. For example, as described in connection with the embodiment of FIG. 3B, only a row of the array is read out at one time. However, since only a portion of the array is read out, the resulting image from all the cells represents a series of lines, each corresponding to the observed scene at a different time. If the observed scene is changing, the resulting image may be motion-skewed, i.e., may have some portions that represent a different instant of time than others. At the same time, it is important that noise be minimized.

FIG. 6 shows an embodiment that accomplishes these goals according to the technique of the present invention, by incorporating additional structure into the basic cell structure. A storage gate electrode 260 overlies a storage potential well 265 in the substrate. The storage well 265 is a supplemental charge storage area which stores charge from the main light collection area—photogate well 80. The size of storage well 265 depends on the necessary charge amount. In low light situations, for example, the area of the optical charge storage area may need to be large in order to collect as much light as possible. However, the charge storage area may never fill. In that case, storage well needs only enough area to store the intended amount of charge. For maximum light-collection capability, however, storage well 265 preferably has a similar surface area as the photogate well 80 to ensure that all the charge accumulated in the photogate well 80 can be transferred to the storage well 265.

The non-photosensitive portion of the pixel cell is preferably shielded from optical radiation by an opaque layer 270, e.g., a metal layer. The non-photosensitive portion of the cell includes the area underlying the intermediate transfer gate 255 and storage gate 260, as well as the transfer gate 35, floating diffusion 40, reset gate 45, and V+ drain 50.

This optical shielding layer 270 minimizes the possibility that optically generated noise affects the charge stored in the storage well 265, or the other identified structures.

The process for operating this modified pixel cell is similar to that described previously. A control system 600 supplies voltage. The charge accumulated in the photogate well 80 under the photogate electrode 30 during the integration period is then transferred across the intermediate transfer gate 255 and into the storage potential well 265. The charge remains in well 265 until readout. The voltage VPg on the photogate electrode 30 is initially greater than the voltage VTg of intermediate transfer gate 255. When the image acquisition is complete, VPg is reduced to less than VTg. This forms potential barrier 105 beneath the photogate electrode 30, thereby providing a downward staircase surface potential from the photogate electrode 30 to the storage well 265 which is being held at a higher positive voltage than the intermediate transfer gate 255. During readout, the floating diffusion node 40 is reset and the reset voltage sampled, as discussed previously. At the time of the readout, the charge is transferred from the storage well 265 over the transfer gate potential 85 and into the floating diffusion node 40, where it is sampled, in the same way the charge was transferred from the photogate well 80 to the node 40 in the first-described embodiment of FIGS. 3A–B and 4.

The techniques of the storage well 265 and transferring of the charge from the photogate well 80 to the storage well 265 after the integration period enables simultaneous integration. The accumulated charge in each cell is transferred to its associated storage well 265 at the end of the integration period. Therefore, all the pixel cells, or a part as desired, can be used to image the observed scene for the duration of the prescribed integration period, regardless of when each individual cell is to be read out. This allows a "snapshot" image to be stored.

The storage well 265 provides a stable structure in which to store the transferred charge. However, an important part of the present invention is the ability to store shuttered information in a way that still allows correlated double sampling.

Different techniques of double sampling are well known in the art. The inventors of the present invention, however, desire to obtain the most possible accuracy. This requires determining the amount of incoming flux with errors that are within the single electron range. The inventors recognize that because of quantum imperfections and fluctuations, it is not possible to obtain certainty about a reset level unless that reset level is actually monitored, each time at the beginning of the cycle. Some previous systems have correlated the reset that occurs at the end of one cycle with the full value at the end of the next cycle. This provides, on the average, a good approximation of the value. However, since we can never be precisely sure of the exact value which is present at the beginning and end of a cycle, this system allows less accuracy than the present invention. This embodiment, allow the flowing diffusion to be monitored prior to the introduction of charge thereto. In this way, the system of the present invention enables a more accurate detection than that which has been available previously. Moreover, and the accumulated and transferred charge can remain in the storage well 265, preferably substantially isolated from noise or leakage, until the time of readout for that cell. The charge is transferred to the floating diffusion 40. The above-described technique ensure there is minimal degradation of the signal produced even though the charge was stored for some period of time, an improved detection values.

This simultaneous integration pixel cell structure trades off the ability to store a snapshot against the fill factor of the cell. The intermediate transfer gate 255 and storage gate 260 take up room on the substrate and are shielded from optical radiation. Therefore, the proportion of the cell that is actively photosensitive is reduced. This may have the effect of lowering the resolution of the cell for any particular cell size.

A certain amount of this real estate can be reclaimed using the technique shown in FIG. 6A. FIG. 6A shows one particular pixel, including a photosensitive part 610, and a non-photosensitive part 612. As described in the preferred embodiment, the non-photosensitive part 612 is covered by blocking layer 270. Planarization layer 614, preferably an opaque layer which does not affect the optical radiation passing therethrough, covers the photosensitive portion 610. This forms a flat surface 616.

As in previous embodiments, a color filter 618 is optionally formed over the planarized layer including the optical blocking layer and the planarization layer. FIG. 6A shows the color filter formed over the entire pixel, but it should be understood that the color filter need not cover the entire pixel since part of this is blocked.

The entire structure is covered by lens 620, which is formed to refract light incoming from over the non-photosensitive area 612 towards the photosensitive area 610. This lens can recapture some of the light which would otherwise fall on the shielded area and refract it to increase some of the resolution.

Figure 7:
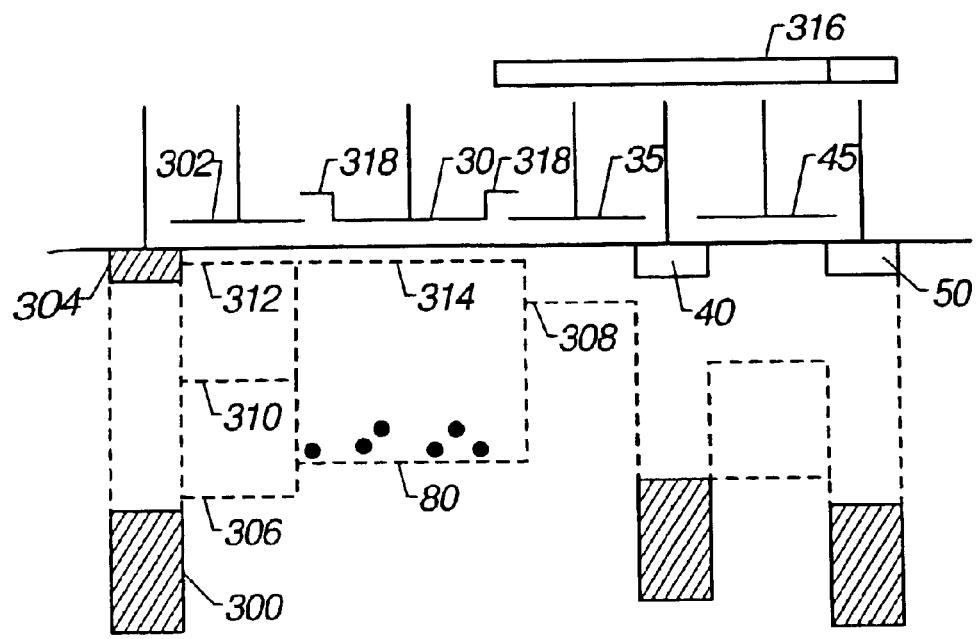
FIG. 7 is a schematic diagram of an alternate embodiment of the cell of FIG. 3A with an electronic shutter and overlapping photogate, including a graph of the surface potential in the charge transfer section.

Another embodiment of the active pixel sensor array allow control over the length of the integration period using alternate electronic shutter shown in FIG. 7. Shutter gate 302 and a shutter drain diffusion 304 are positioned relative to the photogate 30 to bleed off charge away from the photogate. Although shown as a separate elements in FIG. 7, in practice the shutter drain diffusion 304 may also act as the previously described V+ drain 50, either for the same pixel or of an adjacent pixel in the array. In either case, the shutter drain diffusion 304 is maintained at a positive voltage exceeding the potential of the other gates to form a potential well shown as 300 under drain diffusion 304.

The shutter gate 302 and shutter drain diffusion 304 act together to selectively prevent charge accumulation in the associated pixel or allow the accumulation of an optically generated charge under the photogate 30 when desired. Accumulation of charge is prevented by biasing shutter gate 302 to a positive voltage which exceeds the bias on the photogate 30. This forms a potential barrier 306. At the same time the bias on the transfer gate 35 is made less than that on the photogate electrode 30 to form potential barrier 308. This creates a downward staircase in surface potential from the photogate electrode 30 via well 306 to the potential well 300 beneath the shutter drain diffusion 304. This downward staircase allows any optically generated charge in the photogate potential well 80 spills across the shutter gate 302 into potential well 300 and into shutter drain diffusion 304. In this mode, the electronic shutter is effectively "closed" since optically generated charge is not allowed to accumulate.

To begin the accumulation of charge in the photogate potential well 80, the shutter gate bias is changed to a voltage lower than the photogate 30, but slightly higher than the transfer gate 35. This forms potential barrier 310. The inventors prefer making the shutter gate bias slightly higher than that of the transfer gate 35. In the case of a very strong optical signal, the photogate potential well 80 fills until charge begins to flow over the shutter gate potential 310 into the shutter drain diffusion 304. Therefore, charge does not leak past the transfer gate potential 308 and into the floating diffusion node 40 where it could disrupt the readout process described earlier. This specific expedient allows a lateral anti-blooming control in the pixel cell and provides an additional advantage to the electronic shutter structure.

At the end of a selected integration period, the charge accumulated under the photogate 30 is shifted to the floating diffusion node 40 (or storage well) by lowering the shutter gate bias to a voltage below the bias voltage of the transfer gate 35 to form potential barrier 312, and then pulsing the photogate bias to a similar lower voltage to form potential barrier 314. This causes the charge accumulated during the selected integration period to flow over the transfer gate potential 308 and into the floating diffusion node 40. After the transfer of charge, the electronic shutter can be closed once again, or a new integration cycle can be initiated by adjusting the shutter gate and photogate biases as described above.

The section of the pixel cell from the diffusion node 40 side edge of the photogate 30, through the transfer gate 35, floating diffusion node 40, reset gate 45, and V+ drain 50 is preferably covered with an opaque layer 316, such as one made of metal, to block optical radiation and reduce optically-generated noise in the underlying substrate.

In a preferred implementation of the electronic shutter, the shutter gate 302 is biased to the V+ drain potential (i.e., about 5 volts), the photogate 30 is biased to about 4 volts, and the transfer gate 35 is biased to about 1.2 volts, in the "closed" mode. To initiate the integration mode (i.e., "open" the shutter), the shutter gate potential is changed to about 1.5 volts, while the other gate potentials remain the same. The accumulated charge is transferred to the floating diffusion node 40, by setting the shutter gate 302 at 0 volts and the photogate 30 is pulsed to this same potential.

The electronic shutter makes it possible to set a desired integration time for all or some of the cells. The integration time for any one cell is set by simply "opening" the electronic shutter for a predetermined period of time.

Figure 8:
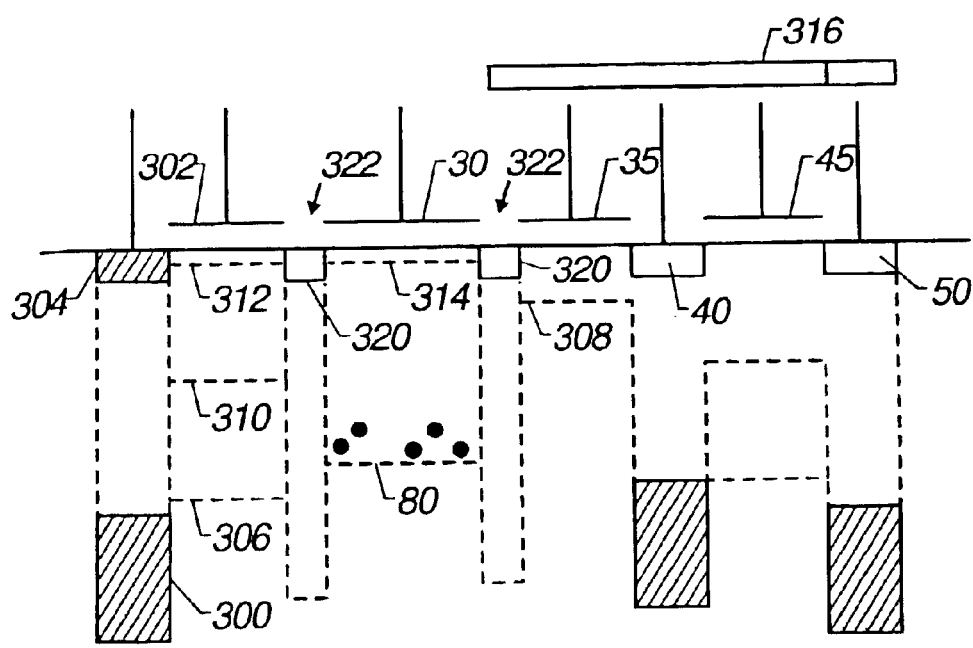
FIG. 8 is a schematic diagram and surface potential graph of the embodiment of FIG. 7 without the overlapping photogate.

The pixel cell in FIG. 7 uses overlapping gates 318. The photogate 30 overlaps the shutter gate 302, and transfer gate 35, over the surface of the pixel cell substrate. This overlapping gate structure enhances the charge transfer efficiency discussed previously. This enhancement results from reducing the area of the substrate that would otherwise have to exist between adjacent gates. This area is placed under the influence of one of the gate potentials. Accordingly, the charge transfer is facilitated. However, there is a tradeoff. The formation of overlapping gates 318 in a CMOS device requires a double poly process. Advanced CMOS fabrication processes which use only a single layer of poly can be used. Therefore, spaced gates with intervening gaps are a necessity in these single poly layer CMOS implementations. In such a structure, floating diffusions 320 are created in the substrate under the gaps 322 between the photogate 30, shutter gate 302, and the transfer gate 35, as shown in FIG. 8.

Any overlap described herein can be replaced a floating diffusion with non-overlapping poly from a single poly layer.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A method of operating an optical pixel cell device comprising:

forming a substrate with an optical blocking layer located adjacent said substrate which divides said substrate into an optically blocked area and an optically unblocked area;

accumulating charge in said optically unblocked area; and storing and processing charge in said optically blocked area.

* * * * *